US006115827A

United States Patent [19]
Nadeau-Dostie et al.

[11] Patent Number: 6,115,827
[45] Date of Patent: Sep. 5, 2000

[54] CLOCK SKEW MANAGEMENT METHOD AND APPARATUS

[75] Inventors: Benoit Nadeau-Dostie; Jean-François Cote, both of Aylmer, Canada

[73] Assignee: LogicVision, Inc., San Jose, Calif.

[21] Appl. No.: 09/209,790

[22] Filed: Dec. 11, 1998

[30] Foreign Application Priority Data

Dec. 29, 1997 [CA] Canada .................................. 2225879

[51] Int. Cl.$^7$ ....................................................... G06F 1/04
[52] U.S. Cl. ........................................... 713/503; 713/502
[58] Field of Search ................................... 713/500, 501, 713/502, 503

[56] References Cited

U.S. PATENT DOCUMENTS

| | | | |
|---|---|---|---|
| 4,692,633 | 9/1987 | Ngai et al. .............................. | 307/269 |
| 5,621,651 | 4/1997 | Swoboda ................................. | 364/489 |
| 5,680,543 | 10/1997 | Bhawmik ............................ | 395/183.06 |
| 5,900,753 | 5/1999 | Cote et al. .............................. | 327/145 |
| 5,909,451 | 6/1999 | Lach et al. ............................ | 371/22.31 |
| 5,949,692 | 9/1999 | Beausang et al. ....................... | 364/491 |

OTHER PUBLICATIONS

Anthes, G.H., "SecurID keeps passwords a'changing," *Computerworld*, pp. 51,52 (Mar. 1994).
Burke S., "At Sun, it's really all in the cards," *Computer Reseller News*, downloaded May 18, 1999, http://www.crn-.com/print–archive/19980420/785inter106.asp (Apr. 1998).
"Coming: A real cash card," downloaded on Feb. 23, 1998, http://www.pathfinder.com@@caok53nzoqeaqho3/asiaweek/95/1103/feat8.html. (Nov. 1995).
Coopers & Lybrand "The mondex project," downloaded on Feb. 23, 1998, http://www.uk.coopers.com/management-consulting/recruitment/mondex.html.

(List continued on next page.)

*Primary Examiner*—William Grant
*Assistant Examiner*—Ronald D Hartman, Jr.

*Attorney, Agent, or Firm*—Fields and Johnson, P.C.

[57] ABSTRACT

A method of testing an integrated circuit having core logic with two or more clock domains and at least one signal path originating in one clock domain and terminating in an other clock domain, each signal path having a source control element in the one clock domain and an associated destination control element in the other clock domain, each the control element being a scannable memory element, the method comprising the steps of, for each the control element shifting a test stimulus into all scannable elements in the core logic; placing an associated source control element in a hold mode for a predetermined number of clock cycles prior to a capture operation so that the source control element holds its output constant during the predetermined number of clock cycles; performing a capture operation for capturing the data output in response to the test stimulus by the control element and by all other scannable elements which are not control elements; maintaining an associated source control element in a hold mode for a predetermined number of clock cycles following a capture operation so that the source control element holds its output constant during the predetermined number of clock cycles; shifting out data captured in the capturing step; and analyzing the data captured in the capturing step. An integrated circuit for use with the method comprises a source control element and an associated destination control associated with each signal path for exchanging data between the one and the other of the clock domains, the source control element being located in the one clock domain and the associated destination element being located in the other domain; each control element being a scannable memory element having an input and an output and being configurable a SHIFT mode for shifting data from its input to its output and a CAPTURE mode for capturing data applied its input, each the source control element being further configurable in a HOLD mode for holding its output constant; and the control elements being configurable in the modes in response to predetermined combinations of a Scan Enable signal for enabling or disabling shifting of data therethrough and a Capture Disable signal having a one value to cause a recipient control element to enable the capture mode and another value to cause a recipient control element to suppress the capture mode.

43 Claims, 12 Drawing Sheets

OTHER PUBLICATIONS

"Information access and electronic commerce," downloaded on Feb. 23, 1998, http://www.mari.co.uk/copinet/ecpaytok.htm.

"ISO7816 (part 1–3) asynchronous smartcard information," downloaded on Feb. 27, 1998, http://www.cryptsoft.com/scard/iso7816–3.txt.

Mondex, "The Mondex wallet: Like having an ATM in your pocket," downloaded on Feb. 23, 1998, http://www.mondexusa.com/html/consumer/walletjs.htm.

Mondex, "Mondex leads with multos: The first open, high security multi–application operating system for smart cards," downloaded on Feb. 23, 1998, http://www.mondexusa.com/html/technology/mdxtech.htm.

Mondex, "The Mondex card," downloaded on Feb. 23, 1998, http://www.mondexusa.com/mondex/cgi–b . . . nglish+global&technology_card.html.

Mondex, "Mondex devices," downloaded on Feb. 23, 1998, http://www.mondexusa.com/mondex/cgi–b . . . ish+global&technology_devices.html.

Mondex, "The Mondex balance reader," downloaded on Feb. 23, 1998, http://www.mondexusa.com/mondex/cbi–b . . . ish+global&technology_balance.html.

Mondex, "Mondex on–line," downloaded on Feb. 23, 1998, http://www.mondexusa.com/mondex/cgi–b . . . sh+global&technology_internet.html.

Mondex, "Frequently asked question: Can you tell me more about Mondex security?," downloaded on Feb. 23, 1998, http://www.mondexusa.com/mondex/cgi–b . . . h/documents/global/faq27087511.txt.

Mondex, "Fequently asked question: How does Mondex work?," downloaded on Feb. 23, 1998, http://www.mondex-usa.com/mondex/cgi–b . . . h/documents/global/faq50730160.txt.

Mondex, "Mondex news: Mondex is launched in New York," downloaded on Feb. 23, 1998, http://www.mondexusa.com/html/main/mondex.htm.

Mondex, "Frequently asked question: How will the scheme be structured?," downloaded on Feb. 23, 1998, http://www.mondexusa.com/mondex/cgi–b . . . h/documents/global/faq64031289.txt.

"Smart cards: A primer," downloaded on Mar. 2, 1998, http://www.javaworld/jw–12–1997/jw–12–javadev.html (Dec. 1997).

Sun Microsystems, "Java card 2.0 programming concepts," Manual, (Oct. 1997).

W3C, "Proposal for an open profiling standard," downloaded Feb. 27, 1998, http://www.w3.org/tr/note–ops–framework.html (Jun. 1997).

CLOCK SKEW MANAGEMENT METHOD AND APPARATUS

The present invention relates, in general, to Integrated Circuits, and, more specifically, to a method of managing clock skew during internal scan and built-in self-test of integrated circuits and an integrated circuit adapted to carry out the method.

BACKGROUND OF THE INVENTION

The testing of integrated circuits has evolved into a highly developed area of technology. Testing may be performed by external equipment, by Built-In Self-Test (BIST) circuitry or by a combination of the two. Generally, all test methods involve shifting data into scannable memory elements in an integrated circuits, capturing the input to the memory elements, shifting the captured data out and then comparing the captured data with predetermined values to determine whether the circuit has performed according to design. As advanced as this field has become, integrated circuits are becoming increasingly more complex and operate at increasingly higher speeds. This has created new problems which existing test methods cannot handle effectively. One problem of particular concern are the effects of clock skew, mis-alignment of clock signals between clock domains, when signals are exchanged between different clock domains in the circuit at high test clock speeds. Clearly, invalid test results would be obtained when a signal originating from a component in one clock domain arrives in a destination component in another clock domain too soon or too late. Thus, measures must be taken to re-time or synchronize the clocks of different clock domains.

Existing re-timing techniques are satisfactory for testing circuits at low speed. However, new testing techniques are required to handle clock skew that is significantly larger than one half of the highest frequency of the circuit for high speed testing.

Several techniques have been proposed for eliminating timing problems between clock domains during scan and scan-based BIST. One method, used in commercial tools, scans in test vectors (test data) into and performs a capture operation on only one clock domain at a time or only on clock domains that do not interact with one another. This eliminates hold problems resulting from a Flip-Flop capturing early such that the result of the capture operation has time to propagate during the same clock cycle to another Flip-Flop located in a different clock domain. The method requires longer test times because only a fraction of the Flip-Flops in the design can capture at any one time. This method cannot be used easily for high-speed testing because it does not provide a mechanism to prevent setup time violation for high-frequency data signals being captured in a different clock domain.

Another method uses Flip-Flops or transparent latches to re-time data signals crossing frequency domain boundaries. This method eliminates hold problems at low frequency and reduces test time since all Flip-Flops capture at the same time. However, the method is not reliable at high frequencies because it provides only about half a clock period of setup and hold time in many cases. Fixed-pulse width clock waveforms must be used in designs with multiple frequencies, thus making clock generation and distribution more difficult.

There is clearly a need for a method that allows data signals to be exchanged safely between clock domains of the same or different frequencies, that leads to efficient automation and that can work in the context of high-speed testing of circuits using logic BIST. Such a method must be capable of providing a setup and hold time of more than the one half of one clock period of the highest frequency used for testing provided by the current methods.

SUMMARY OF THE INVENTION

The method of the present invention provides a robust way of interfacing Flip-Flops belonging to different clock domains during a structural scan-based test. The method provides for an arbitrary number of clock cycles of a reference test clock to be used for setup and hold time in the vicinity of the time of the capture operation. The method is compatible with most scan and BIST methods applied to edge-triggered circuits and does not cause an increase of test time. The method is such that complex interactions between several clock domains, operating at the same or different frequency, are easily controlled. The method requires minimal additional circuitry and additional control signals which are not timing critical.

One aspect of the present invention is generally defined as a method of testing an integrated circuit having core logic with two or more clock domains and at least one signal path originating in one clock domain and terminating in an other clock domain, each signal path having a source control element in the one clock domain and an associated destination control element in the other clock domain, each the control element being a scannable memory element, the method comprising the steps of, for each the control element shifting a test stimulus into all scannable elements in the core logic; placing an associated source control element in a hold mode for a predetermined number of clock cycles prior to a capture operation so that the source control element holds its output constant during the predetermined number of clock cycles; performing a capture operation for capturing the data output in response to the test stimulus by the control element and by all other scannable elements which are not control elements; maintaining an associated source control element in a hold mode for a predetermined number of clock cycles following a capture operation so that the source control element holds its output constant during the predetermined number of clock cycles; shifting out data captured in the capturing step; and analyzing the data captured in the capturing step.

Another aspect of the present invention is defined as an integrated circuit having core logic with two or more clock domains and at least one signal path originating in one of the clock domains and terminating in an other of the clock domains, the improvement comprising a source control element and an associated destination control associated with each signal path for exchanging data between the one and the other of the clock domains, the source control element being located in the one clock domain and the associated destination element being located in the other domain; each control element being a scannable memory element having an input and an output and being configurable a SHIFT mode for shifting data from its input to its output and a CAPTURE mode for capturing data applied its input, each the source control element being further configurable in a HOLD mode for holding its output constant; and the control elements being configurable in the modes in response to predetermined combinations of a Scan Enable signal for enabling or disabling shifting of data therethrough and a Capture Disable signal having a one value to cause a recipient control element to enable the capture mode and another value to cause a recipient control element to suppress the capture mode.

BRIEF DESCRIPTION OF THE DRAWINGS

These and other features of the invention will become more apparent from the following description in which reference is made to the appended drawings in which:

FIGS. 17, 18, 19 and 20 illustrate three possible embodiments of Flip-Flops with HOLD capability, but adapted to provide for an arbitrary number of cycles for setup and hold.

DETAILED DESCRIPTION OF PREFERRED EMBODIMENTS OF THE INVENTION

Before describing the present invention in detail it would be useful to review the basic structure of integrated circuits having multiple clock domains and existing methods of re-timing the various required clocks. The following description refers to FIGS. 1–5.

FIGS. 1–4 each illustrate a portion of the core logic 10 of an integrated circuit. In each case, the core logic includes two combinational Logic modules CL1 and CL2 and four scannable memory elements in the form of Flip-Flops 12, 14, 18 and 20 and a re-timing element 16. Flip-Flops 12 and 14 and re-timing element 16 are driven by Clock A, Flip-Flop 18 is driven by Clock B and Flip-Flop 20 is driven by Clock C. Re-timing element 16 was provided to avoid the problem that the outputs of Flip-Flops 12 and 14 could change before Flip-Flops 18 and 20 have had an opportunity to capture the response to the test stimulus shifted into all of the Flip-Flops during when performing a test of the circuit. Without re-timing element 16, the circuit has one clock cycle of setup margin and no hold margin. With the re-timing element, the circuit has one-half of one clock cycle of both setup margin and hold margin. While these margins are satisfactory for low speed testing, they are not sufficient for testing at high speed.

Figure 1:
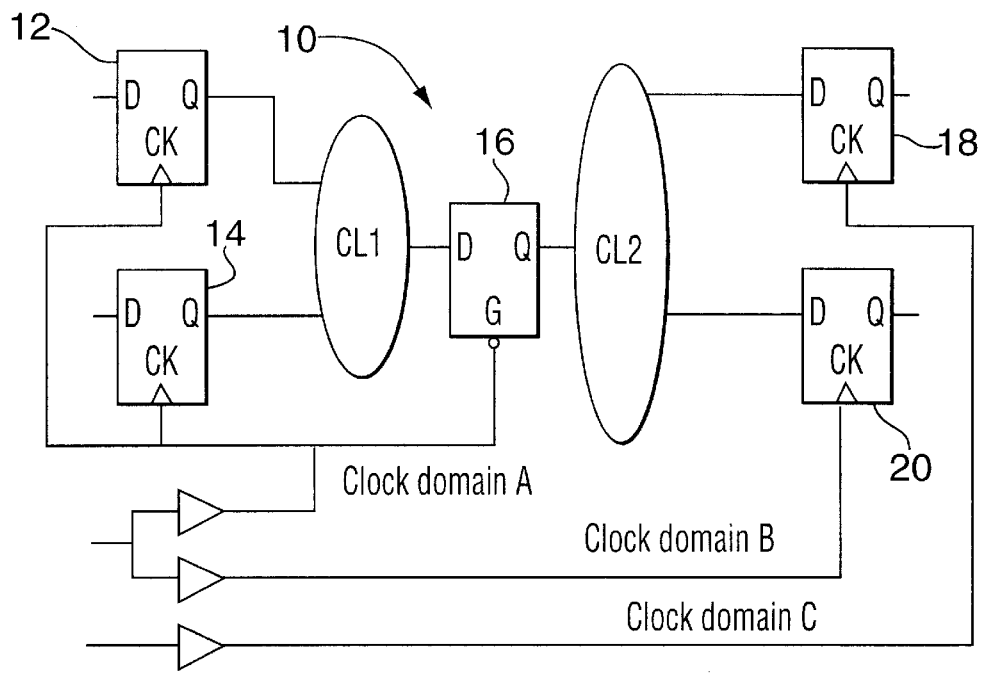
FIG. 1 diagrammatically illustrates a portion of the core logic of a integrated showing a prior art method of re-timing at source Flip-Flops of three clock domains.
Figure 2:
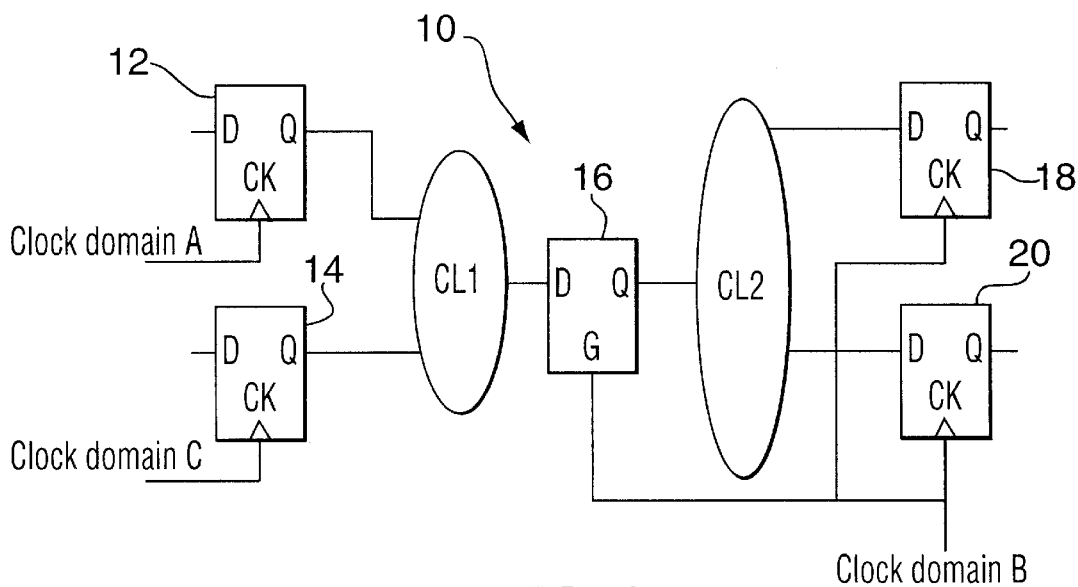
FIG. 2 is similar to FIG. 1 but illustrates re-timing at destination Flip-Flops of the three clock domains.
Figure 3:
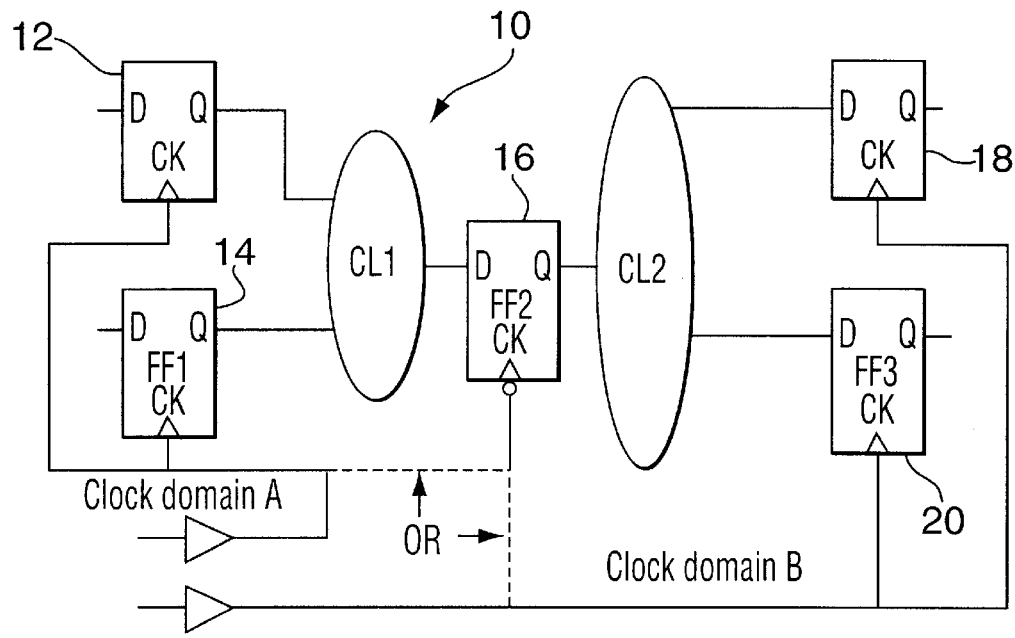
FIG. 3 diagrammatically illustrates a simple case of another prior art method of re-timing Flip-Flops by inverting the clock input to Flip-Flops connecting clock domains.
Figure 4:
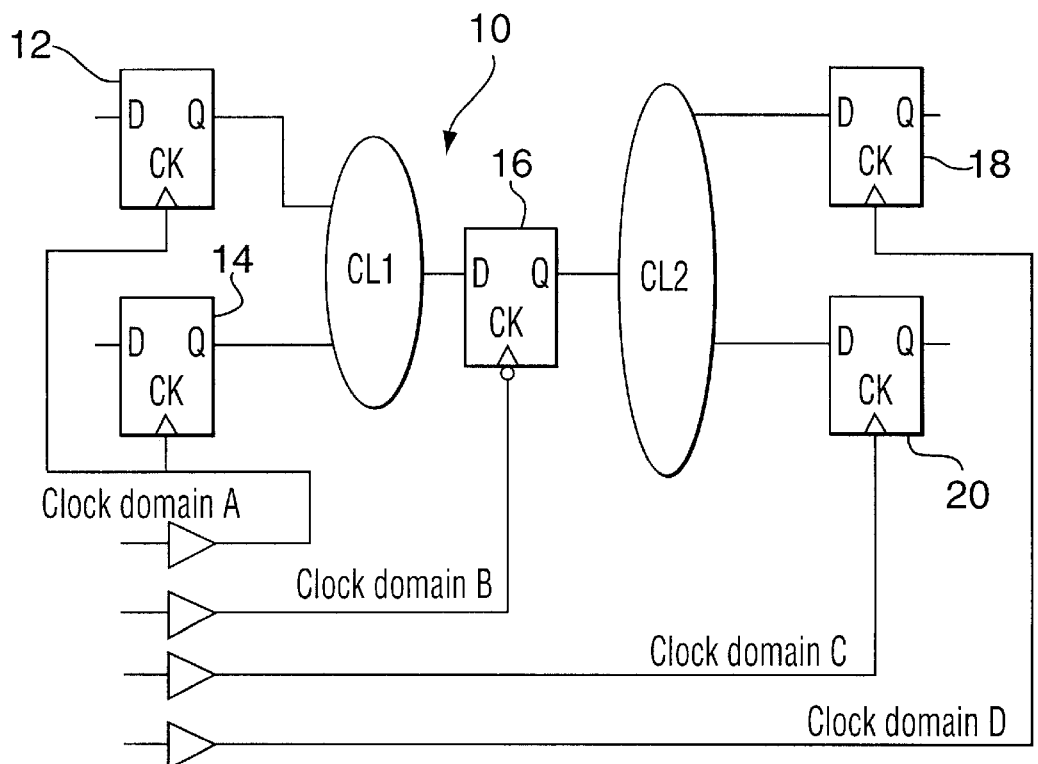
FIG. 4 is diagrammatically illustrates a more complex example of the prior art method of FIG. 3.

In FIG. 1, the clocks for the three clock domains A, B and C are provided at the source. This arrangement can only be used for 50% Duty Cycle or fixed-pulse width clocks. In FIG. 2, the clocks are provided at the destination. This arrangement can only be used when Clock B is a fixed-pulse width when Clocks A and/or B have a higher frequency than Clock B. FIGS. 3 and 4 show simple and more complex structures, respectively, in which Flip-Flops are clocked on a clock signal having the opposite polarity from that of the domain clock signal. In FIG. 4, the frequency of Clock B must be either fixed-pulse width or as high as the frequency of Clock A.

Figure 5:
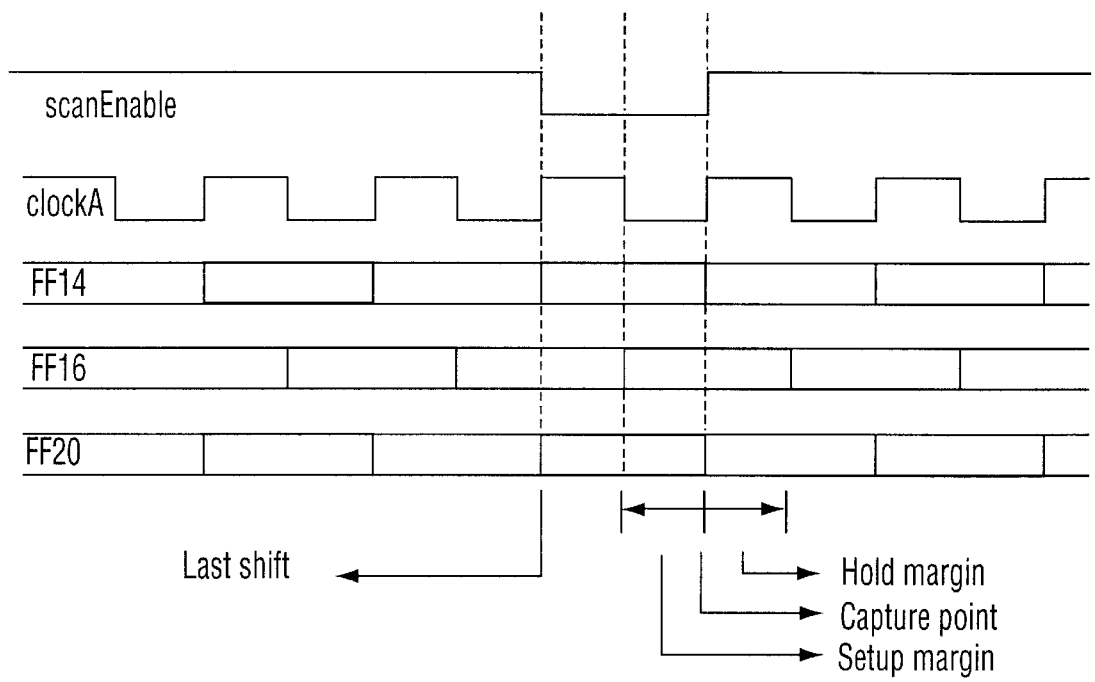
FIG. 5 is a timing diagram for the methods of FIGS. 3 and 4.

FIG. 5 illustrates the timing diagram for the procedure for testing the circuits of FIGS. 3 and 4, including a ScanEnable signal, Clock A and the states of Flip-Flops 14 and 20 and re-timing element 16. It will be noted that a capture operation is performed on the rising edge of a Clock A, shown by the vertical dashed line, when the ScanEnable signal is low. Existing methods provide a setup margin and a hold margin of only one-half of the clock cycle of the originating clock, Clock A, in FIG. 5. The setup margin is the number of clock cycles preceding a capture operation in which a Flip-Flop holds its output constant. The hold margin is the number of clock cycles following a capture operation in which a Flip-Flop holds its output constant.

The method generally employed requires re-timing data signals which cross frequency domain boundaries using re-timing element 16. This method is useful for eliminating hold problems at low frequency and reduces test time compared to prior methods because all Flip-Flops can capture at the same time. However, the circuit requires modification for and does not operate at high frequencies because only about half a clock period of setup and hold time is provided, as shown in the timing diagram of FIG. 5. Fixed-pulse width clock waveforms, such as shown U.S. Pat. No. 5,349,587, must be used in cases where multiple frequencies are used, as in FIG. 2, thus making clock generation and distribution more difficult.

The present invention provides a method and an improved integrated circuit structure which ensure that adequate setup and hold margins can be provided to permit a signal originating at the output of one element in one clock domain to be held long enough for the signal to propagate to the input of the destination element in another clock prior to a capture at the destination element. As will be seen, the invention not only overcomes the problem of clock skew between clock domains, it permits all of the clock domains to be tested in a single test procedure.

By way of overview, the improved integrated circuit of the present invention is characterized by a source control element and an associated destination control associated with each signal path, extending between clock domains, for exchanging data between the clock domains. The source control element is located in one clock domain and the associated destination element is located in the other domain. Each control element is a scannable memory element having an input and an output and is configurable a SHIFT mode for shifting data from its input to its output and in a CAPTURE mode for capturing data applied its input.

Each source control element being further configurable in a HOLD mode for holding its output constant. The control elements are configured in these modes by predetermined combinations of a Scan Enable signal for enabling or disabling shifting of data therethrough and a Capture Disable signal having a one value which causes a recipient control element to enable the capture mode and another value to cause a recipient control element to suppress the capture mode.

The method involves, for each control element, shifting a test stimulus into all scannable elements in the core logic of the circuit, placing an associated source control element in the hold mode for a predetermined number of clock cycles prior to a capture operation so that said source control element holds its output constant during said predetermined number of clock cycles, performing a capture operation for capturing the data input in response to the test stimulus at the control element and at all other scannable elements which are not control elements, maintaining the associated source control element in a hold mode for a predetermined number of clock cycles following a capture operation, shifting out data captured in the capturing step, and analyzing the data captured in said capturing step.

If it is desired to test the current control element with additional test vectors or patterns, the steps are repeated as a part of one test procedure. In a preferred embodiment of the invention, the control elements are divided into compatibility groups and the test is performed in connection with groups of control elements as opposed to individual elements. In some circuits, this may considerably reduce the number of passes which need to be made to capture all of the data required to conduct a complete test of the circuit.

Figure 6:
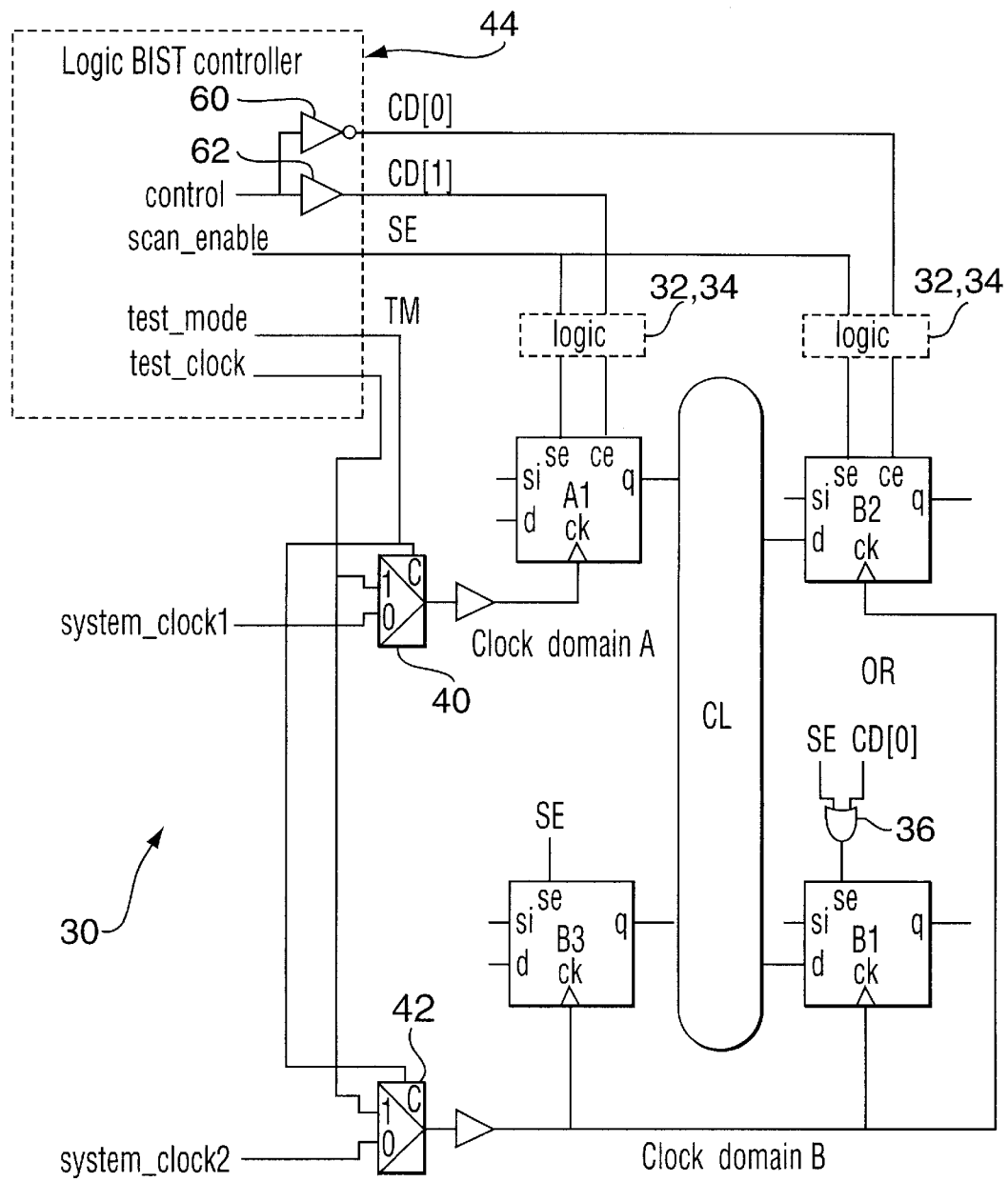
FIG. 6 diagrammatically illustrates an example of a portion of an integrated circuit core logic structured according to a preferred embodiment of the present invention and having two clock domains arranged in two domain groups and a controller for controlling scan and capture operations.

These concepts will become clearer by referring to FIG. 6 which illustrates a simple example of a circuit 30 having only two clock domains. Other examples described later illustrate circuits with more than two clock domains. Circuit 30 includes a combinational logic block CL1 and three controllable, scannable memory elements in the form of Flip-Flops A1, B2, and B1. It is assumed herein that the combinational logic block is designed such that every output depends on every input; however, it is to be understood that this is not required for proper operation of the invention and is only used to simplify the description. As mentioned, the circuit includes two clock domains, namely, Clock Domain A which includes control element A1 driven by system_clock1 under normal operation and Clock Domain B which includes control elements B2 and B1 and a non-controllable scannable memory element B3 driven by system_clock2 under normal operation. The terms "controllable" and "non-controllable" refer to control by a Capture Disable signal described later. Circuit 30 has two signal paths which traverse clock domain boundaries. One path originates in Clock Domain A at the output of control element A1, traverses logic block CL1 and terminates in Clock Domain B at the input of control element B2. The other signal path also originates in Clock Domain A at the output of control element A1, traverses logic block CL1 and terminates in Clock Domain B at the input of control element B1. In both of these paths, A1 is a source control element. In the first path, B2 is a destination control element while in the second path, B1 is a destination control element. Description which follows later explains the procedure for designating control elements as source and destination elements.

Each of control elements A1, B2 and B1, is responsive to a Scan Enable signal, SE, and to Capture Disable signal, generally designated by CD[n] where n is an integer. In the case of control elements A1 and B2, Capture Disable signals CD[1] and CD[2], respectively, are applied to intermediate logic blocks 32 and 34, respectively. In the case of control element B1, Capture Disable signal CD[0] is applied to a logic block 36 which consists of a simple OR-gate. In most instances, the intermediate logic blocks output the Scan Enable signal, se, and a clock enable signal, ce. Logic blocks 32 and 34 are shown in dashed lines because their circuitry may differ as explained later with in the description of FIGS. 8, 9 and 10. In other instances, as in the case of logic block 36, the logic blocks merely outputs the scan enable signal, se. The latter is the case when the control element does not provide an output to other control elements.

The system clock signals, system clock1 and system_clock2, are applied to the low input of multiplexers 40 and 42, respectively. A Test Clock signal, test_clock, is applied to the high input of each of the multiplexers, as shown. A Test Mode signal, TM, is applied to the control input of the multiplexers. The multiplexers need not be part of the circuit. When they are not part of the circuit, the same clock is applied to the Flips-Flops of all clock domains, clock domains A and B in this case. The balance of the description assumes that the multiplexers are part of the circuit, which is usually the case in BIST applications.

Each of the Capture Disable, Scan Enable and Test Mode signals may have a value of 1 or 0 and are provided to the circuit from either primary inputs of the circuit or from a Logic BIST controller 44. In all embodiments described herein, Logic BIST controller is present and provides the required control signals. A high value, 1, for a Capture Disable signal indicates that the recipient control element must suppress a capture operation. Conversely, a low value, 0, indicates that the associated control element is allowed to perform a capture operation.

Figure 8:
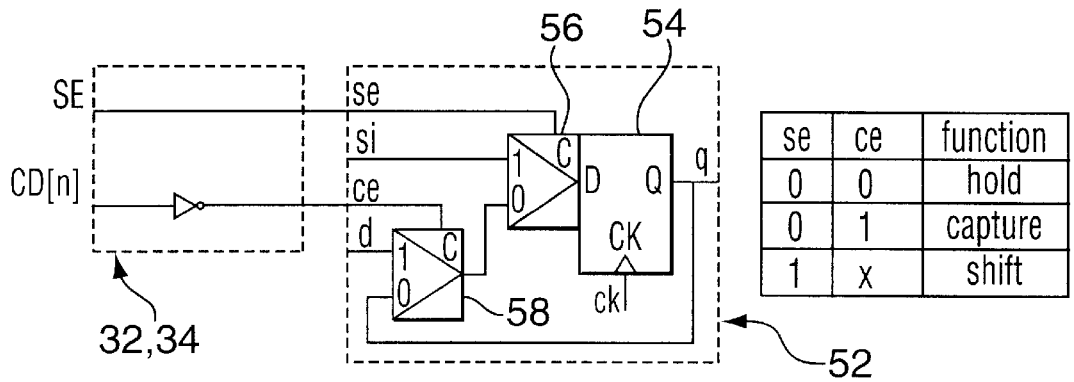
FIGS. 8, 9 and 10 illustrate three possible embodiments of Flip-Flops which can be used in the embodiment of FIG. 7 to link clock domains.
Figure 9:
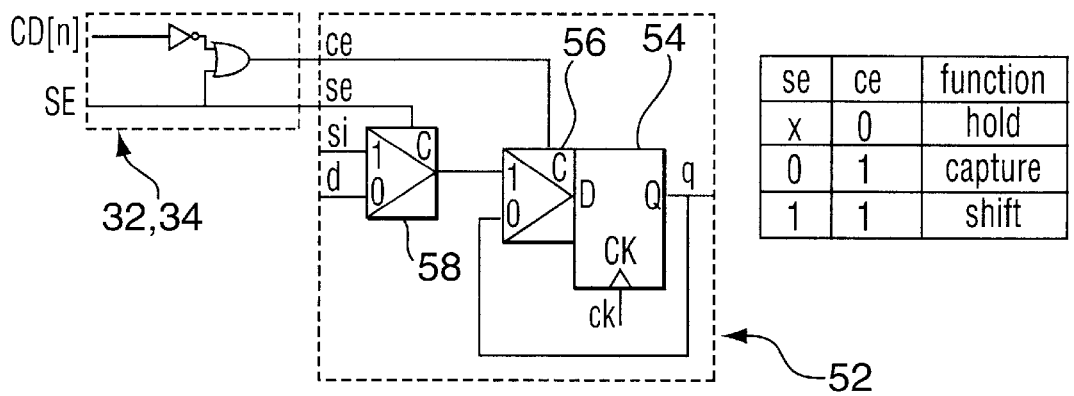
Figure 10:
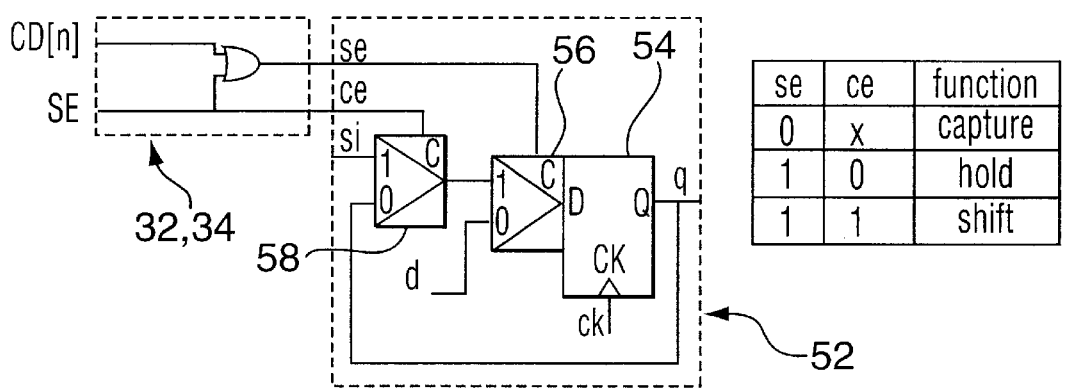

Before describing the operation in more detail, it would be useful to review the construction of the logic blocks with reference to FIGS. 8, 9 and 10 which illustrate circuitry of three possible embodiments of logic blocks and associated control elements, although it will be understood by those skilled in the art that other embodiments are possible.

Figure 11:
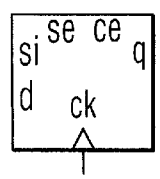
FIGS. 11 and 20 illustrate the symbol used to designate a control element according to the present invention.

The logic blocks 32 and 34 are contained within the dashed rectangles on the left side of the Figures. The control elements are shown in dashed lines 52 on the right side of the Figures. FIG. 11 illustrates the symbol for the control elements. A truth table is provided to the right of each Figure.

In general, each logic circuit receives the Scan Enable signal, SE, and Capture Disable signal, CD[n]. The outputs of the logic blocks are scan enable signal, se, and clock enable signal, ce, as previously mentioned, The control elements are generally comprised of a Flip-Flop 54 and a pair of multiplexers 56 and 58. From the truth tables, it will be seen that the combination of the logic blocks and control elements provides three functions, namely a HOLD function which applies the output Q of the Flip-Flop to its input D; a CAPTURE function which applies core logic data output d to the input D of the Flip-Flop and a SHIFT function which applies an input si to the input D of the Flip-Flop. As is well known to those skilled in the art, the si input is used to shift data, either test data or captured data, into and through the circuits in synchronism with the clock signal applied to the clock input of the Flip-Flop. The three circuits provide what are called "Priority Scan", "Priority Hold" and "Priority Data". Which of these circuits is used is not important insofar as the present invention is concerned, although this consideration is important to a circuit designer. The three implementations have been included herein because they are easily synthesizable.

With reference once again to FIG. 6, a fundamental problem the present seeks to overcome is that, in test mode (TM=1), the test clock distributed to all Flip-Flops in the design does not necessarily arrive concurrently at the clock input of all Flip-Flops in different clock domains. This is known as "clock skew". In circuit 30, this can result in Flip-Flops B2 and B1 capturing erroneous data output by A1, through combination logic CL1, if the data arrives too late or too soon. The solution provided by the present will now be explained.

In the design of the circuit, the fanin of each control element of the design is examined to locate control elements originating from a different clock domain. If at least one such element is found, the control element, whose fanin is being examined, is called a "destination" element and all control elements in its fanin that are part of a different clock domain are called "source" elements. Thus, in FIG. 6, considering the fanin to A1, A1 does not receive signals originating from a different clock domain. Considering the fanin of B2 and B1, each receive the output of A1 which is in a different clock domain. Thus, A1 is designated as a source control element and each of B2 and B1 is designated as a destination control element. Considering B3, while there are paths between B3 and each of B2 and B1, these three elements are all part of the same clock domain, and, accordingly, B3 does not qualify as a control element because it does not interface with a different clock domain and all fanins to B3 are in the same clock domain.

Source Flip-Flops are provided an additional holding multiplexer 56 or 58 as shown in FIGS. 8–10, if there is any chance for its associated destination Flip-Flop to capture invalid data due to clock skew. In FIG. 6, A1 has already been so modified. A1, in a prior art method, would originally only have had one multiplexer used to implement the scan function.

Source control elements are controlled in such a manner that they hold their output constant after the scan-in operation when an associated destination control element is enabled to perform a capture operation for the current test pattern. Source control elements are enabled to perform a capture operation only when none if its associated destination elements or any destination elements they may feed, is enabled to perform a capture. In FIG. 6, CD[1] controls the capture operation of control element A1. CD[0] does the same for B2 and B1. The two signals are mutually exclusive so that the source and associated destination control elements are never permitted to perform a capture operation at the same time.

As previously mentioned, the exact implementation of the logic that combines the CD[n] signals and the scan enable SE signal is slightly different for the three types of Flip-Flops and is shown in FIGS. 8–10. Advantageously, the control signals se and ce, generated by the small logic blocks and applied to the source or destination control elements, can be shared by several control elements to keep the implementation cost of the technique to a minimum.

Figure 7:
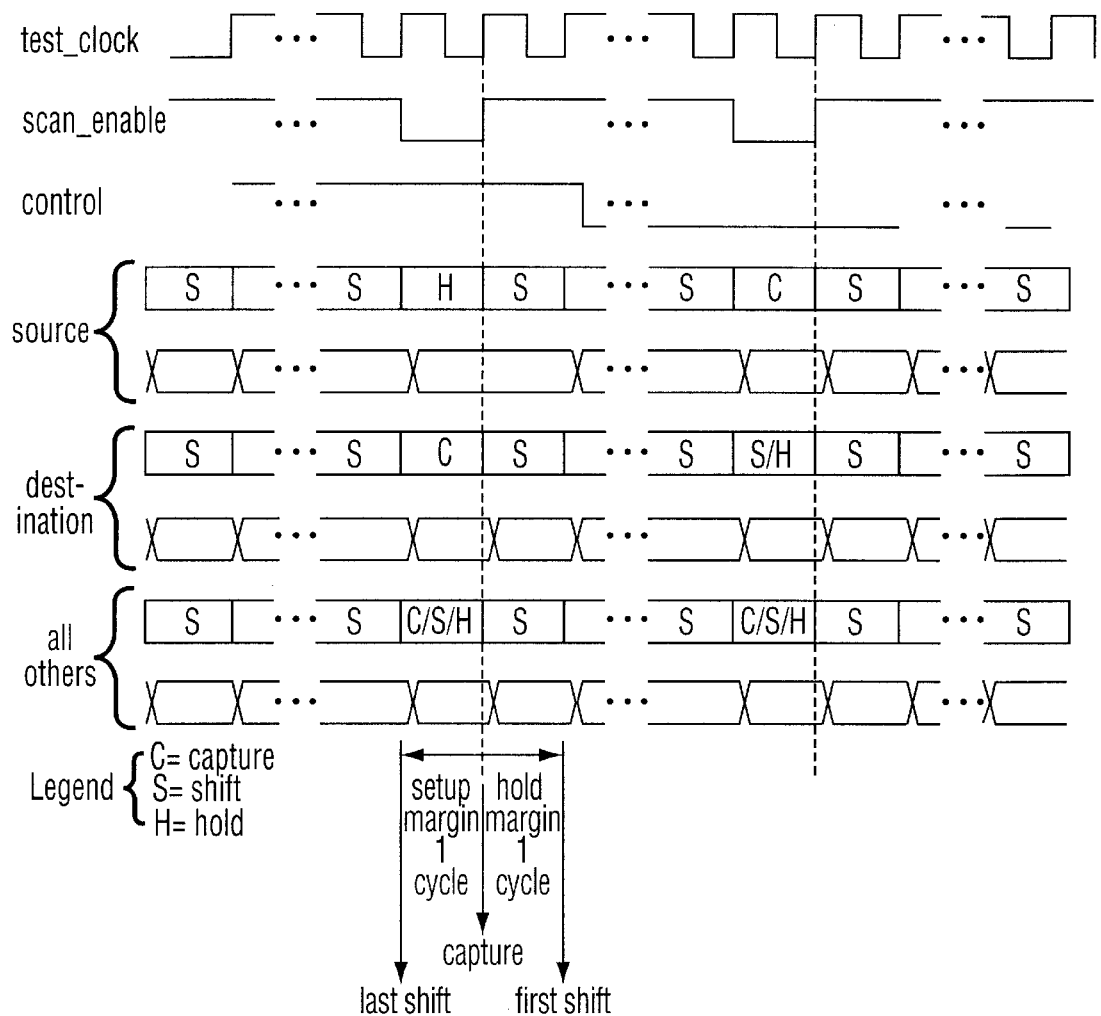
FIG. 7 is a timing diagram for the embodiment of FIG. 6.

FIG. 7 illustrates a portion of the timing of signals if the vicinity of the salient portions of a test performed according to the present invention as well as the state of source and destination control elements and non-control elements ("All Others"). The first signal shows the clock, test_clock, used to run a test. It is shown as a free running clock since it is the most common scenario for BIST. However, this is not a restriction of the method. A gated clock may also be used.

The second signal in FIG. 7 is the Scan Enable signal, SE. This signal is present in any scan test using a multiplexer in front of an edge-triggered Flip-Flop. When the Scan Enable signal is high on the active edge, rising edge in this example, of the clock, all scannable memory elements, including control elements, transfer data from their respective si input to their Q output. This shifting operation is shown as S in the diagrams for the Source, Destination and All Others. When the Scan Enable signal is low on the active edge of the clock, the Flip-Flop transfers data from its D input to its Q output. This is the capture operation and is indicated by a C. Note the all non-control elements are permitted to perform a capture at all opportunities. The two vertical dashed lines in FIG. 7 represent capture operations.

Capture Disable signal, CD[n], determines whether the source control element, A1, or the destination control elements, B2 and B1, will be allowed to perform a capture operation. It will be recalled that a value of 1 means that the control element is to suppress the capture operation the next time the scan enable signal is low and an active edge of the clock occurs and, conversely, a value of 0 means that the control element is allowed to perform a capture operation the next time the scan enable signal is low and an active edge of the clock occurs. When the control element is a source element that receives a high Capture Disable signal, it must not only suppress the capture operation, it must hold its output constant. When the control element is a destination element that receives a high Capture Disable signal, it must suppress its capture operation. In FIG. 6, this is achieved by applying a signal called "control" to the input of each of inverter 60 and buffer 62. Inverter 60 outputs CD[0], which is applied to B2 and B1. Buffer 62 outputs CD[1] which is applied to A1. This guarantees that Capture Disable signal applied to a source element is always opposite that applied to its destination elements.

FIG. 7 shows the succession of Shift, Capture and Hold operations and the transition time of their output for each of Source, Destination and other, non-control elements. The exact value of the output is not important in this analysis. The important point is when the output can potentially change.

For the first scan pattern, the "control" signal is high throughout the first Shift-In operation (Scan Enable high) and during the first occurrence of SE=0 and active clock edge, the first capture operation. Note that the Source element is placed in a Hold mode, H, rather than in a capture mode, one cycle before the first capture. It can be seen that the output of the source element, A1, remains stable for two clock cycles around the time the destination control elements, B2 and B1, capture their respective inputs, indicated by a C. In this example, it is assumed this provides enough time for the output of A1 to propagate to the input of B2 and B1 while, at the same time, ensuring the value expected by B2 and B1 does not disappear before it has been captured.

For the second test pattern, the "control" signal is low throughout the second Shift-In operation (Scan Enable high) to the second occurrence of SE=0 and active clock edge, the second capture operation. The source control element A1 captures its input and the destination control elements, B2 and B1, ignore the output of A1 by suppressing the capture operation.

All Flip-Flops that do not either receive or source signals to Flip-Flops of other domains ("All Others" in FIG. 7) are not affected by this sequence and can perform a capture following every Scan-In operation i.e. every time Scan Enable is 0 and an active edge of the clock occurs.

Other important points to note from the timing diagram of FIG. 7 are that the "control" signal can be easily set at the beginning of each Shift-In operation and therefore is not timing critical and that multiple tests and captures may be performed in one continuous process.

The suppression of the capture operation at the destination element can be done in two ways as shown in FIGS. 6 and 7. The suppression of the capture can be achieved by the use of a holding multiplexer, which is the case with B2, or by causing the control element to remain in the Shift mode which is the case with B1. The advantage of the latter, is that it requires no Flip-Flop replacement. A single gate 36 can be used to control several Flip-Flops. However, if the destination Flip-Flop is also a source Flip-Flop, i.e. its output fans out to a Flip-Flop of a different clock domain, then a Flip-Flop with a holding multiplexer, such as shown in FIGS. 8–10, must be used.

Compatibility Groups

Figure 12:
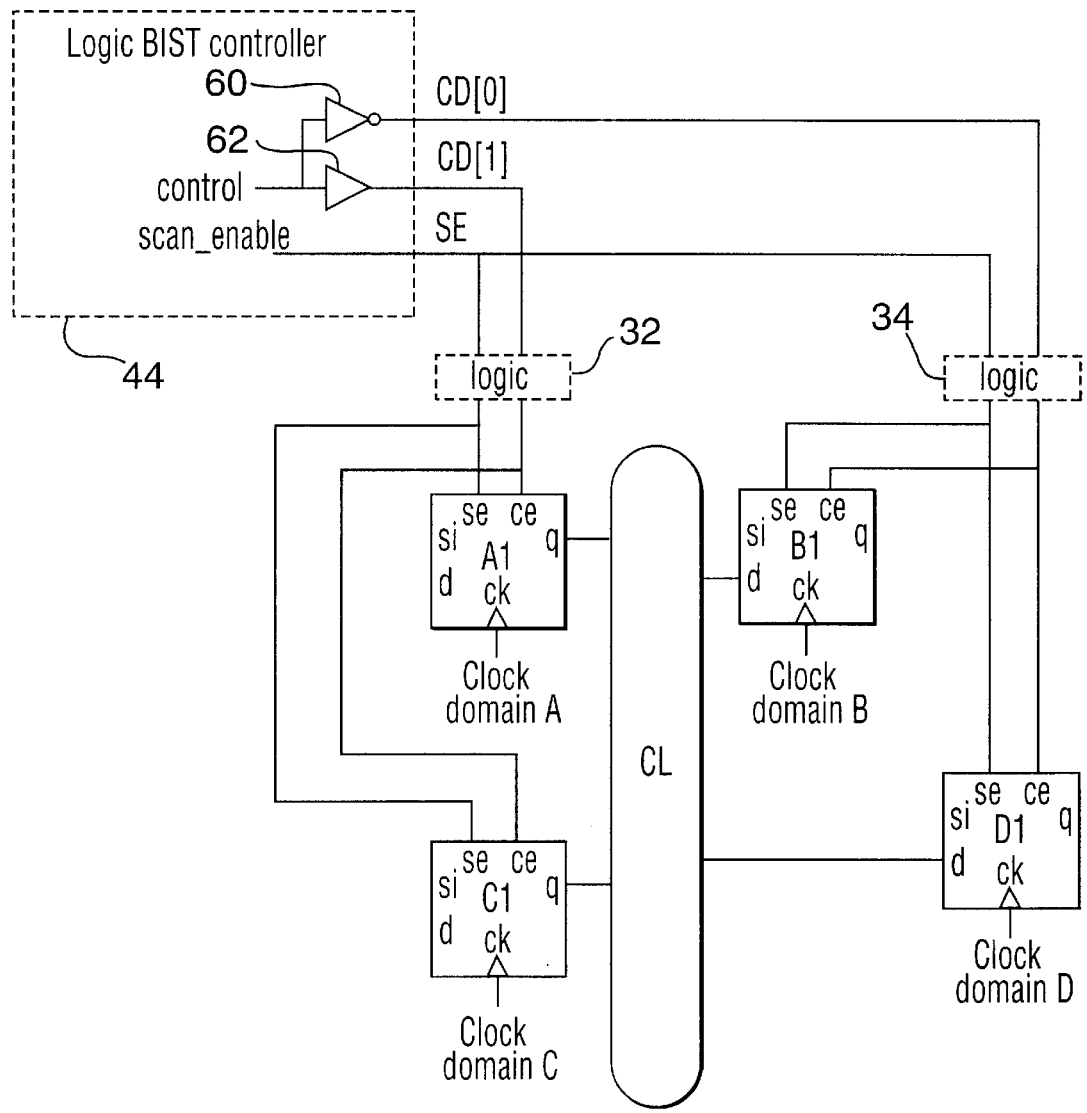
FIG. 12 is a diagram similar to FIG. 6 but illustrating four clock domains arranged in two domain groups.

The description will now turn to FIG. 12 which illustrates a more complex circuit having four clock domains A, B, C and D and four control elements A1, B1, C1 and D1. This Figure is employed to introduce the concept of compatibility groups which is a method which allows certain control elements to share control signals when a circuit consists of more than two clock domains.

When a circuit contains more than two clock domains, the control elements are assigned to a compatibility group based on the analysis of the circuit. Two clock domains (say A and C) are in the same clock compatibility group if the control elements of the two clock domains do not exchange data signals i.e. there is no signal path from the output of a control element in clock domain A to the input of a control element in clock domain C or vice-versa. The minimum number of compatibility groups for a particular circuit can be determined by a simple graph coloring algorithm, well known in the art. Each node of the graph represents a clock domain and an arc between two clock domains indicates that a path exists between the two domains in one or both directions. It is advantageous to determine the minimum of compatibility groups in order to minimize the number of control elements whose capture operation must be suppressed for a given test pattern and, thereby, reduce the test length. FIG. 12 shows a circuit which has four clock domains, but only two compatibility groups. Control elements, A1 and C1, in clock domains A and C do not exchange data signals and can be assigned the same compatibility group to share control signals SE and CD[1]. Similarly, control elements B1 and D1 in clock domains B and D, respectively, do not exchange data signals between them, but both receive signals from clock domain A and C. Thus, control elements B1 and D1 can also share the same control signals SE and CD[0] and can be assigned to the same compatibility group.

Figure 13:
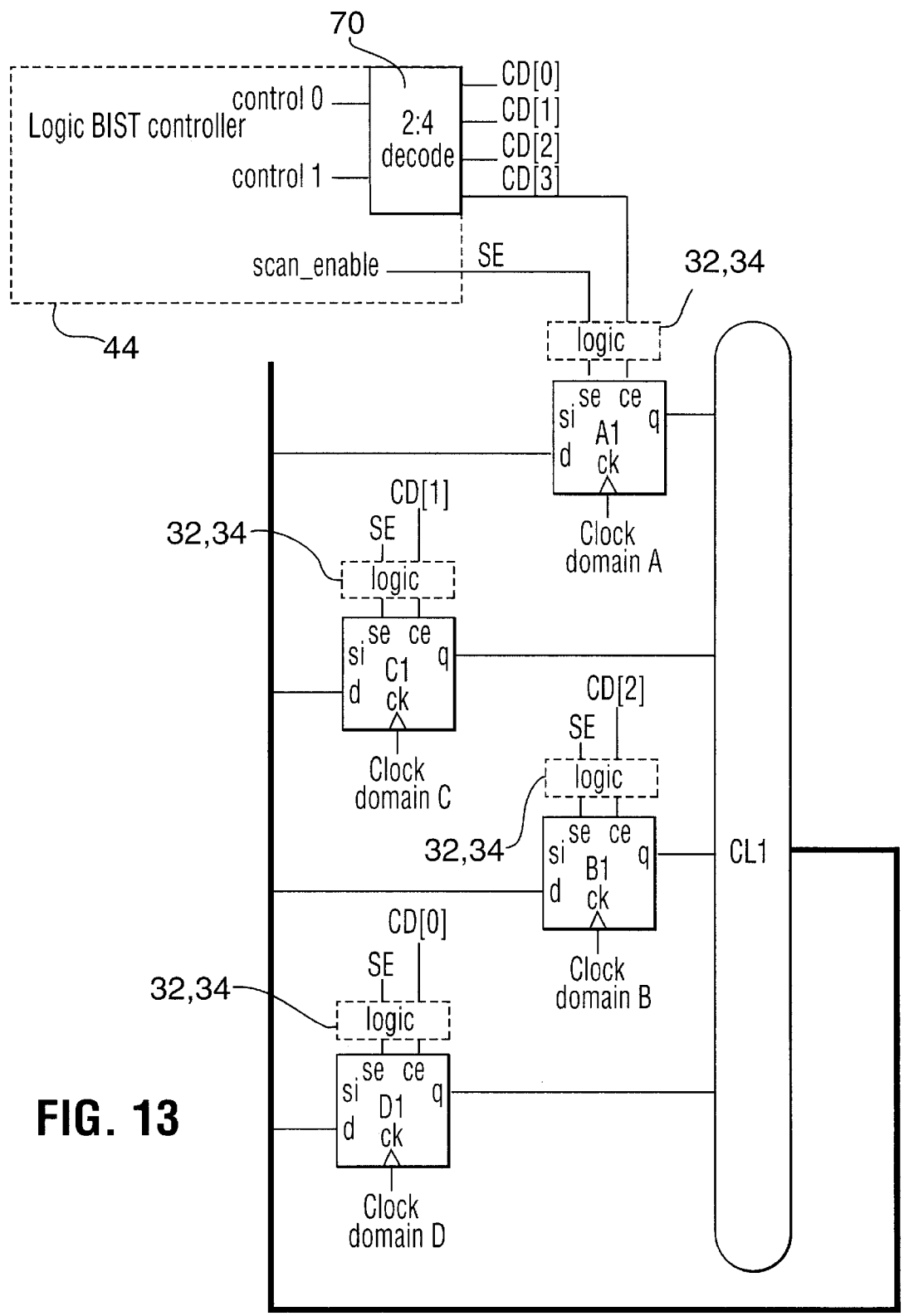
FIG. 13 is a diagram similar to FIGS. 6 and 12 but illustrating four clock domains arranged in four domain groups.

The circuit in FIG. 13 is more complex still. This Figure has four clock domains and each control element, A1, B1, C1, and D1, exchanges data signals through combinational block CL, and 12 signal paths, one from each control element to each of the other control elements. Accordingly, four compatibility groups must be provided, one for each control element. The control signals, which must be unique for each compatibility group, may be provided by a simple decoder 70 driven by control signals, Control0 and Control1, generated by the logic BIST controller 44 which will ensure that the control signals of the holding multiplexers are exclusive for the four groups, i.e. that only one of the Capture Disable signals, CD[n], will be low at any time so as to allow capture in one compatibility group at a time.

If the number of compatibility groups is not a power of 2, the unused states of decoder 70 can be assigned arbitrarily to any of the clock groups to keep the test length to a minimum. For example, in FIG. 13, if only clock domains A, B and C were present, output CD[0] would not be connected to any control element and the combination of Control1=0 and Control0=0 would cause all compatibility groups to be disabled. Instead, the combination can be used to enable the capture in one of the compatibility groups A, B or C. Some experimentation might be required to determine the best choice to reassign the unused states. It is expected that the impact on test length will be negligible.

Figure 14:
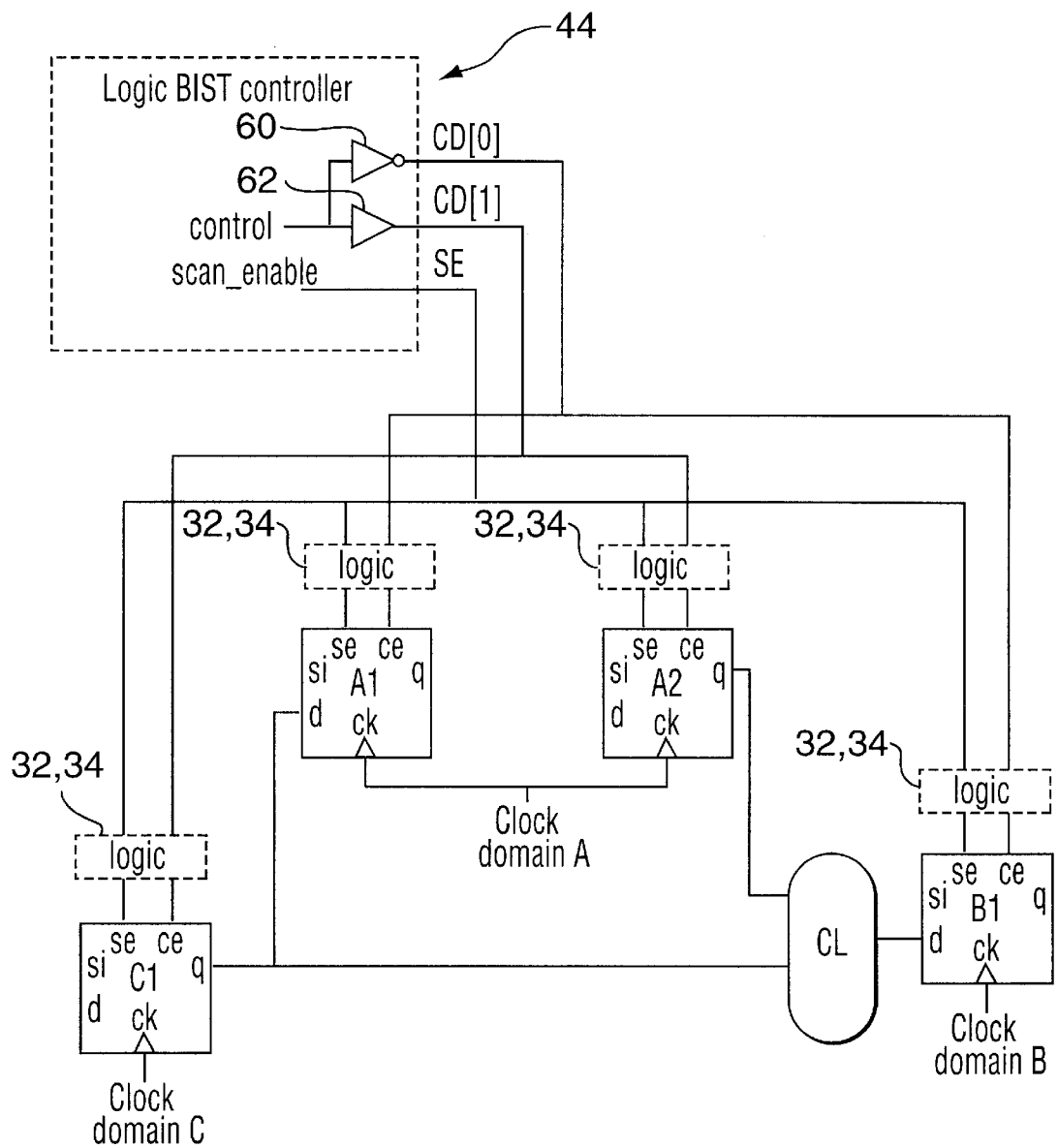
FIG. 14 is a circuit diagram illustrating four control elements in three clock domains and arranged in two compatibility groups and demonstrates how different compatibility group configurations are possible.

It is possible for control elements which reside in one clock domain to be assigned to different compatibility groups as illustrated in FIG. 14. This example includes four control elements A1, A2, B1 and C1 and three clock domains, A, B and C. Control elements A1 and A2 reside in clock domain A, control element B1 resides in clock domain B and element C1 resides in clock domain C. The example also shows that the control elements have been arranged into two compatibility groups defined by Capture Disable signals CD[0] and CD[1]. Control elements A1 and B1 are part of Group 0, which provides CD[0], and control elements A2 and C1 are part of Group 1 which provides CD[1]. An alternative Group arrangement would be to assign control elements A1 and A2 to the same Group. To do so, would require three Groups, instead of the two shown in FIG. 14, because control element C1 must reside in a different Group from A1 and B1 must reside in a different Group from A2. The three Groups would include one for control elements A1 and A2, one for control element B1 and one for control element C1. This is so because A1 and C1 exchange signals across a clock domain and likewise for A2 and B1. It is desirable to minimize the number of compatibility groups in order to reduce the complexity of the circuit, i.e. a smaller number of Capture Disable signals CD[n] are required and a maximum number of memory elements are captured concurrently, thereby minimizing the impact on test time duration or length.

Multi-Cycle Signal Paths

In some cases, it might be necessary to provide more than one test clock cycle of setup and/or hold time at about the time that a destination control element performs a capture of its data input. A detailed circuit timing analysis will dictate the exact requirements. Co-pending U.S. patent application Ser. No. 08/752,499, incorporated herein by reference, discloses a method of providing an arbitrary number of clock cycles of setup time before a capture operation. Source control elements in signal paths longer than one clock period of the reference test clock are replaced by Flip-Flops identical to the ones shown in FIGS. 8–10. Those Flip-Flops are controlled to enable a hold mode a pre-determined number of clock cycles before the capture cycle.

Figure 15:
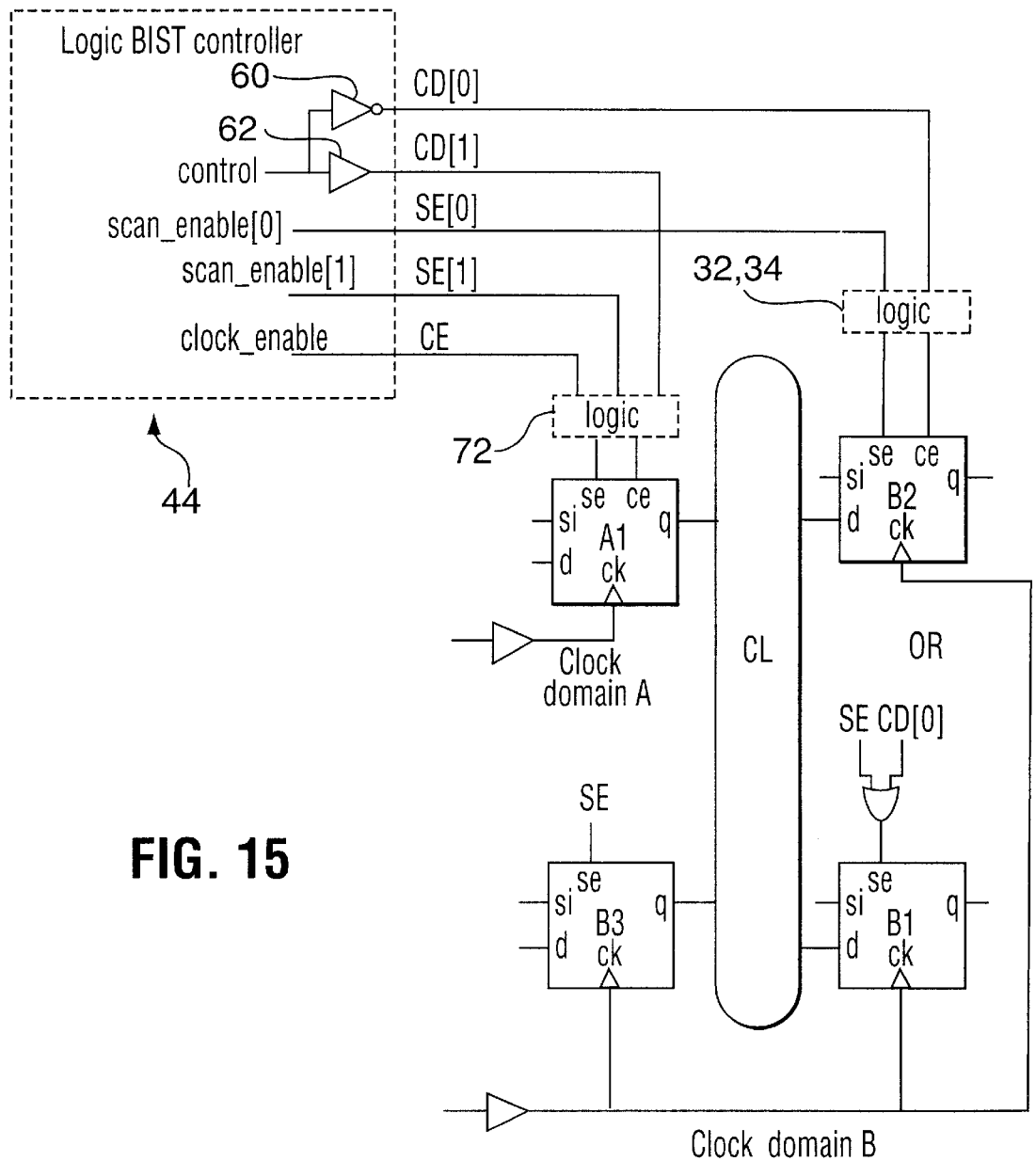
FIG. 15 is a diagram similar to FIGS. 6, 12 and 13 but illustrating a arrangement having a half frequency or a multi-cycle path.
Figure 16:
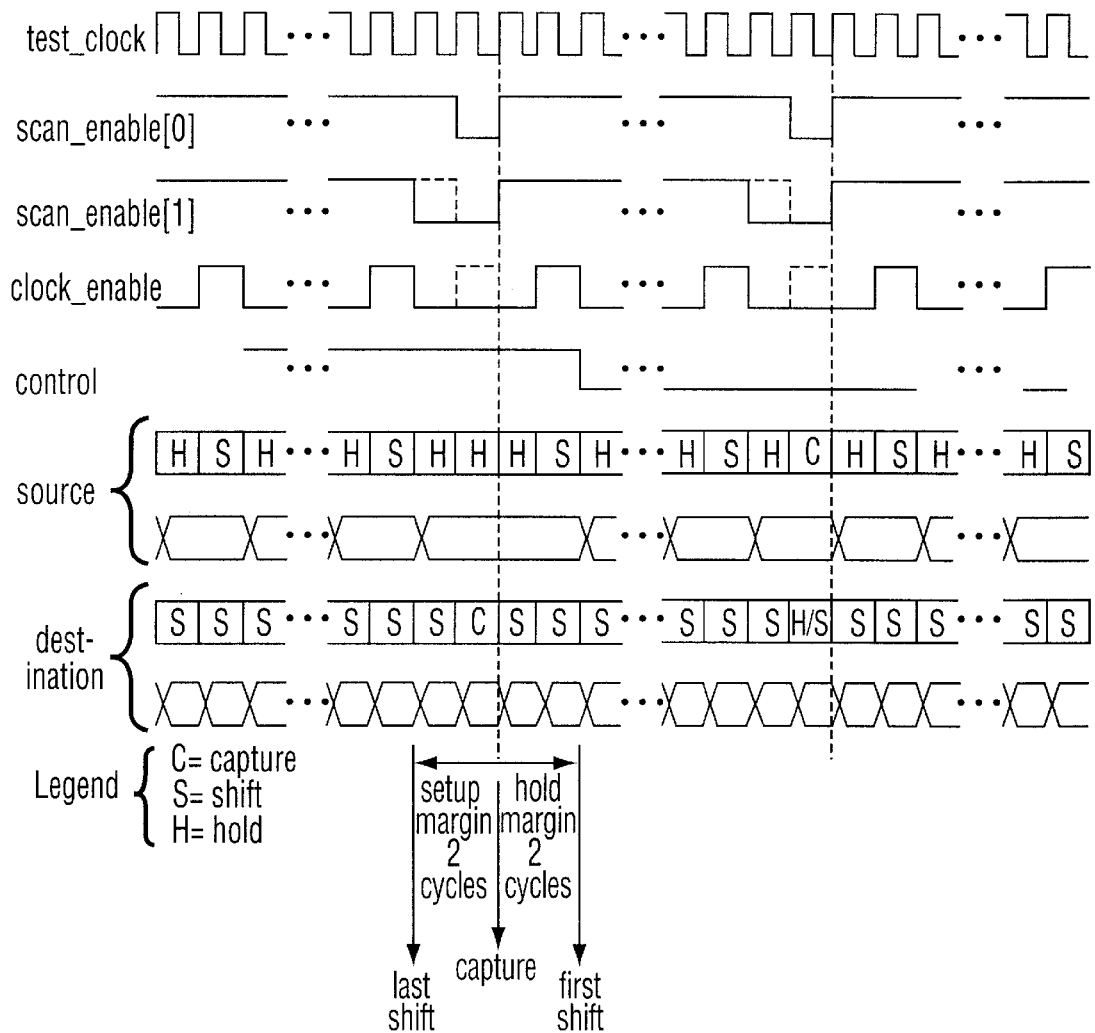
FIG. 16 is a timing diagram for the embodiment of FIG. 15.
Figure 17:
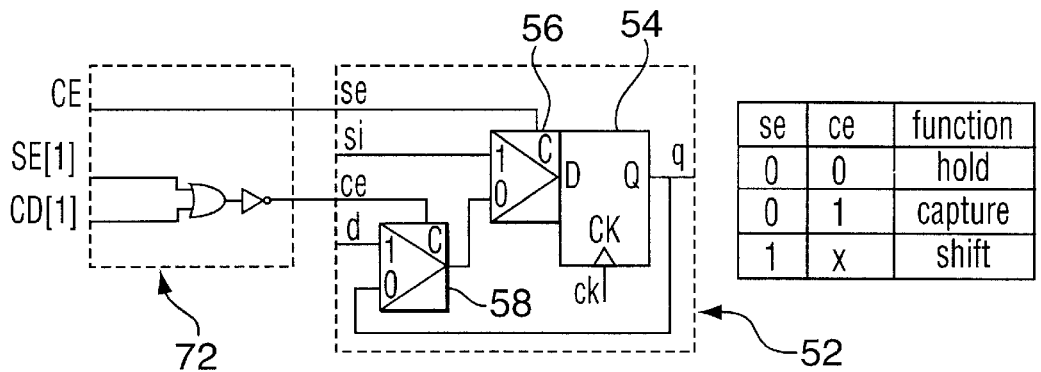
Figure 18:
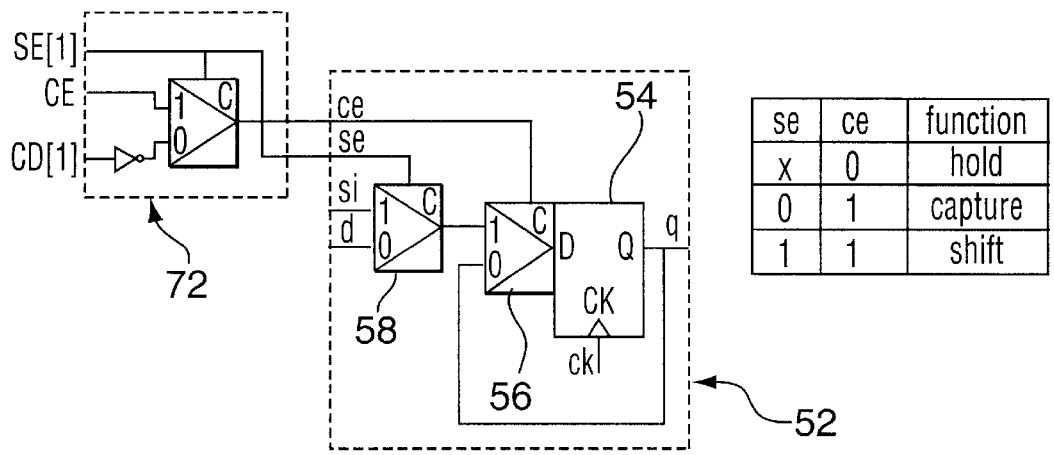
Figure 19:
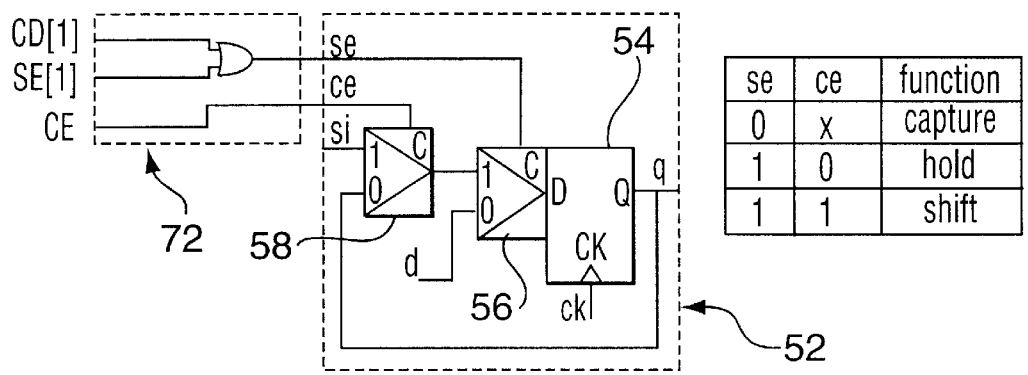
Figure 20:
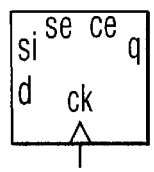

In the circuit illustrated in FIG. 15 and in its associated timing diagram in FIG. 16, an additional Scan Enable signal, SE[1], and Clock Enable, CE, are provided in order to control all control elements that are a source of signal paths longer than one clock period but less than two clock cycles, irrespective of the destination of the signal path. These additional signals are applied to a Logic Block 72, which, like Logic Blocks 32 and 34, may take various forms. Three embodiments are shown in FIGS. 17–19. FIGS. 17–19 are similar to FIGS. 8–10, respectively, and accordingly like reference numerals designate like parts. It will be seen that, in each embodiment, Logic Block 72 receives SE[1], CE and CD[1] and outputs modified Scan Enable signal, se and clock enable signal, ce.

It will be noted from FIG. 16 that the circuit provides for a setup and hold margins of two test clock cycles. In the first capture operation, the source elements are placed in a Hold mode two clock cycles prior to the capture operation and remain in that mode for two clock cycles following the capture operation. Similar comments apply to the second capture operation; however since the control element is to perform a capture, it is placed in the Capture mode just prior to the capture, and then in a Hold immediately following the capture.

Other control signals can be defined for a different number of clock cycles of setup margin, as described in aforementioned application Ser. No. 08/752,499. If the same Flip-Flops need to be controlled so that they also provide the same number of clock cycles of hold time after the capture cycle, control signals SE[1] and CE must be combined with the appropriate CD[n] signals as shown in FIGS. 15 and 17–20.

Multi-Frequency case

In multiple frequency cases, i.e., when different clock domains have different clock rates, the implementation of the clock skew management technique is the same as that for the single frequency case described above. However, if a source control element is clocked at a lower frequency than the reference test clock, the number of clock cycles of setup and hold time is simply equal to the frequency ratio of the reference test clock and the clock of the source flip-flop.

The identification of source and destination Flip-Flops, as well as their replacement by control elements according to the present invention can be automated easily since only static analysis of the connections and some input from the designer are required. No dynamic simulation of the circuit is required.

It will be understood that many modifications and alterations may be made to the above described invention without departing from the spirit of the appended claims.

We claim:

1. In a method of testing an integrated circuit having core logic with two or more clock domains and at least one signal path originating in one clock domain and terminating in another clock domain, each signal path having a source control element in said one clock domain and an associated destination control element in said other clock domain, each said control element being a scannable memory element, said method comprising the steps of, for each said control element:
   (a) shifting a test stimulus into all scannable elements in said core logic;
   (b) placing an associated source control element in a hold mode for a predetermined number of clock cycles prior to a capture operation so that said source control element holds its output constant during said predetermined number of clock cycles;
   (c) performing a capture operation for capturing the data input in response to said test stimulus at said control element and at all other scannable elements which are not control elements;
   (d) maintaining an associated source control element in a hold mode for a predetermined number of clock cycles following a capture operation so that said source control element holds its output constant during said predetermined number of clock cycles;
   (e) shifting out data captured in said capturing step; and
   (f) analyzing said data captured in said capturing step.

2. A method as defined in claim 1, said predetermined number of clock cycles being at least one cycle.

3. In a method as defined in claim 1, said predetermined number of clock cycles being a sufficient number of clock cycles to permit data output from said source control element to propagate to said destination control element prior to said capture operation.

4. A method as defined in claim 1, said capture operation including capturing the input of all other control elements which do not interact with the clock domain containing said each control element.

5. A method as defined in claim 1, further including arranging said control elements into compatibility groups, each said group containing at least one control element and any other control element which does not interact with the clock domain of another control element in the group and which is not a member of another group, said shifting, capturing and analyzing steps for each group rather than for each control element such that said capturing step comprises capturing the data output by all control elements of the group and by all other scannable elements which are not control elements in response to said test stimulus.

6. In a method of testing an integrated circuit as defined in claim 1, further including the steps of producing, for each cycle of a Test Clock, a Scan Enable signal and a Capture Disable signal for each said control element, said Scan Enable signal being operable to enable or disable shifting at a control element and said Capture Disable signal be operable to enable or disable capture at a control element.

7. In a method of testing an integrated circuit as defined in claim 6, further including the steps of, for each cycle of a Test Clock and in response to the combination of said Scan Enable signal and said Capture Disable signal, placing a recipient control element in one of a SHIFT mode to permit shifting of data through said recipient control element, a CAPTURE mode for capturing the input of said recipient control element or a HOLD mode for holding the output of said recipient control element constant.

8. In a method of testing an integrated circuit as defined in claim 5, each source control element being located in one of said groups and its associated destination control element being located in another of said groups so that while one of said source and associated destination control elements is in a capture mode, the other of said source and associated destination control elements is in a capture suppression mode.

9. In a method as defined in claim 1, further including performing said analyzing step concurrently with said step of shifting out and shifting in test data for a following test concurrently with said step of shifting out.

10. In a method of testing an integrated circuit having core logic with two or more clock domains and at least one signal path originating in one clock domain and terminating in another clock domain, each signal path having a source control element in said one clock domain and an associated destination control element in said other clock domain, each said control element being a scannable memory element, said control elements being arranged into compatibility groups, each said group containing at least one control element and any other control element which does not interact with the clock domain of another control element in the group and which is not a member of another group, said method comprising the steps of, for each said group:
   (a) shifting a test stimulus into all scannable elements in said core logic;
   (b) for each control element in said group:
      i. placing an associated source control element in a hold mode for a predetermined number of clock cycles prior to a capture operation so that said source control element holds its output constant during said predetermined number of clock cycles;
      ii. performing a capture operation for capturing the data input, in response to said test stimulus, to said control element and by all other scannable elements which are not control elements; and iii. maintaining an associated source control element in a hold mode for a predetermined number of clock cycles following a capture operation so that said source control element holds its output constant during said predetermined number of clock cycles;

(c) shifting out data captured in said capturing step; and (d) analyzing said data captured in said capturing step.

11. A method as defined in claim 10, said predetermined number of clock cycles being at least one cycle.

12. In a method as defined in claim 10, said predetermined number of clock cycles being a sufficient number of clock cycles to permit data output from said source control element to propagate to said destination control element prior to said capture operation.

13. A method as defined in claim 10, said capturing step including capturing the input to all other control elements which do not interact with the clock domain containing said each control element.

14. In a method of testing an integrated circuit as defined in claim 10, further including the steps of producing a Scan Enable signal and a Capture Disable signal for each said compatibility group for each cycle of a test clock, said Scan Enable signal being operable to enable or disable shifting at a control element and said Capture Disable signal be operable to enable or disable capture at a control element.

15. In a method of testing an integrated circuit as defined in claim 13, further including the steps of, for each cycle of a test clock and in response to the combination of said Scan Enable signal and said Capture Disable signal, placing a recipient control element in one of a SHIFT mode to permit shifting of data through said recipient control element, a CAPTURE mode for capturing the input to said recipient control element and a HOLD mode for holding the output of said recipient control element constant.

16. In a method of testing an integrated circuit as defined in claim 10, each source control element being located in one of said groups and its associated destination control element being located in another of said groups so that while one of said source and associated destination control elements is in a capture mode, the other of said source and associated destination control elements is in a capture suppression mode.

17. In a method as defined in claim 15, further including performing said analyzing step concurrently with said step of shifting out and shifting in test data for a following test concurrently with said step of shifting out.

18. In a method of testing an integrated circuit having core logic with two or more clock domains and at least one signal path originating in one clock domain and terminating in an other clock domain, each signal path having a source control element in said one clock domain and an associated destination control element in said other clock domain, each said control element being a scannable memory element and being configurable in a Shift mode for shifting data through said elements and a Capture mode for capturing data applied to the input thereof, each said source control element being further configurable in a Hold mode for holding its output constant, said control elements being arranged into compatibility groups each said group containing at least one control element and any other control element which does not interact with the clock domain of another control element in the group and which is not a member of another group, said method comprising the steps of, for each said group:

(a) configuring all scannable memory elements in a Shift mode;

(b) shifting a test stimulus into all scannable elements in said core logic;

(c) for each control element in said group:

i. configuring an associated source control element in a Hold mode for a predetermined number of clock cycle of a test clock prior to a capture operation so that said source control element holds its output constant during said predetermined number of clock cycles, said predetermined number of clock cycles being a sufficient number of clock cycles to permit data output from said source control element to propagate to said destination control element prior to said capture operation;

ii. performing a capture operation for capturing the data input, in response to said test stimulus, to said control element and to all other scannable elements which are not control elements, including capturing the input to all other control elements which do not interact with the clock domain containing said each control element; and iii. configuring an associated source control element in a Hold mode for a predetermined number of clock cycles following a capture operation so that said source control element holds its output constant during said predetermined number of clock cycles;

(d) configuring all scannable elements in a Shift mode for shifting out data captured in said capturing step; and (e) analyzing said data captured in said capturing step concurrently with said step of configuring all scannable elements in a Shift mode for shifting out data captured in said capturing step.

19. A method as defined in claim 18, said predetermined number of clock cycles being at least one cycle.

20. A method claim 18, said steps of configuring including producing a Scan Enable signal and a Capture Disable signal for each said compatibility group for each cycle of a test clock, said Scan Enable signal being operable to enable or disable shifting at a control element and said Capture Disable signal be operable to enable or disable capture at a control element.

21. In an integrated circuit having core logic with two or more clock domains and at least one signal path originating in one of said clock domains and terminating in an other of said clock domains, the improvement comprising:

a source control element and an associated destination control element associated with each signal path for exchanging data between said one and said other of said clock domains, said source control element being located in said one clock domain and said associated destination element being located in said other domain;

each said control element being a scannable memory element having an input and an output and being configurable a SHIFT mode for shifting data from its input to its output and a CAPTURE mode for capturing data applied its input, each said source control element being further configurable in a HOLD mode for holding its output constant; and said control elements being configurable in said modes in response to predetermined combinations of a Scan Enable signal for enabling or disabling shifting of data therethrough and a Capture Disable signal having a one value to cause a recipient control element to enable said CAPTURE mode and another value to cause a recipient control element to enable said HOLD mode.

22. In an integrated circuit as defined in claim 21, further including a controller for generating said Capture Disable signal for each said control element and for each cycle of a test clock signal.

23. In an integrated circuit as defined in claim 21, further including means for generating said Capture Disable signals and applying said Capture Disable signals to all of said control elements such that only one of said control elements receives said one value and all other control elements receive said other value.

24. In an integrated circuit as defined in claim 21, further including Logic Circuit means associated with each said control element and responsive to said Scan Enable signal and said Capture Disable signal for generating control element configuring signals for configuring each said control element in one of said modes.

25. In an integrated circuit as defined in claim 24, further including means for applying said control element configuring signals to all control elements which are to be concurrently configured in the same manner.

26. In an integrated circuit as defined in claim 21, each said control elements including a Flip-Flop having an input, an output and a clock input, and means responsive to said Scan Enable and a Capture Enable signal for configuring said Flip-Flop in a SHIFT mode for shifting data through said Flip-Flop, a CAPTURE mode for capturing data at said Flip-Flop output or a HOLD mode.

27. In an integrated circuit as defined in claim 21, said HOLD mode comprising connecting said Flip-Flop output to said Flip-Flop input.

28. In an integrated circuit as defined in claim 26, said means responsive being first and second multiplexers each having a control input, a pair of inputs and an output, one of said multiplexers receiving one of said Scan Enable and Capture Disable signals at its control input and the output of the other of said multiplexers and one of the output of said Flip-Flop, a data input from said core logic and Shift data, and an output connected to said Flip-Flop input; the other of said multiplexers receiving the other of said Scan Enable and said Capture Disable signals at its control input and the other two of the output of said Flip-Flop, a data input from said core logic and Shift data and having an output connected to an input to the other of said multiplexers.

29. In an integrated circuit as defined in claim 21, further including a clock source for the clock signal required by said clock domains, further including means responsive to a Test Mode signal and associated with each said clock signal for selecting said associated clock signal during normal operation of said circuit and for selecting test clock signal during testing of said circuit.

30. In an integrated circuit as defined in claim 21, said control elements being arranged in groups in which each group contains at least one of said control elements and any other element which does not interact with the clock domain of an other element in the group and which is not in a member of another of said groups, each member in each group receiving the same Scan Enable and Capture Disable signals.

31. In an integrated circuit having core logic with two or more clock domains and at least one signal path originating in one of said clock domains and terminating in an other of said clock domains, the improvement comprising:

a source control element and an associated destination control element associated with each signal path for exchanging data between said one and said other of said clock domains, said source control element being located in said one clock domain and said associated destination element being located in said other domain, said control elements being arranged in groups in which each group contains at least one of said control elements and any other element which does not interact with the clock domain of an other element in the group and which is not in a member of another of said groups, each member in each group receiving the same Scan Enable and Capture Disable signals;

each said control element being a scannable memory element having an input and an output and being configurable a SHIFT mode for shifting data from its input to its output and a CAPTURE mode for capturing data applied its input, each said source control element being further configurable in a HOLD mode for holding its output constant; and said control elements being configurable in said modes in response to predetermined combinations of a Scan Enable signal for enabling or disabling shifting of data therethrough and a Capture Disable signal having a one value to cause a recipient control element to enable said CAPTURE mode and another value to cause a recipient control element to enable said HOLD mode.

32. In an integrated circuit as defined in claim 31, further including a controller for generating said Capture Disable signal for each said group and for each cycle of a test clock signal.

33. In an integrated circuit as defined in claim 31, further including means for generating said Capture Disable signals and applying said Capture Disable signals to all of said control elements such that only one of said control elements receives said one value and all other control elements receive said other value.

34. In an integrated circuit as defined in claim 31, further including Logic Circuit means associated with each said group and responsive to said Scan Enable signal and said Capture Disable signal for generating control element configuring signals for configuring each said control element in said group in one of said modes.

35. In an integrated circuit as defined in claim 34, further including means for applying said control element configuring signals to all control elements which are to be concurrently configured in the same manner.

36. In an integrated circuit as defined in claim 31, each said control elements including a Flip-Flop having an input, an output and a clock input, and means responsive to said Scan Enable and a Capture Enable signal for configuring said Flip-Flop in a SHIFT mode for shifting data through said Flip-Flop, a CAPTURE mode for capturing data at said Flip-Flop output or a HOLD mode.

37. In an integrated circuit as defined in claim 36, said HOLD mode comprising connecting said Flip-Flop output to said Flip-Flop input.

38. In an integrated circuit as defined in claim 36, said means responsive being first and second multiplexers each having a control input, a pair of inputs and an output, one of said multiplexers receiving one of said Scan Enable and Capture Disable signals at its control input and the output of the other of said multiplexers and one of the output of said Flip-Flop, a data input from said core logic and Shift data, and an output connected to said Flip-Flop input; the other of said multiplexers receiving the other of said Scan Enable and said Capture Disable signals at its control input and the other two of the output of said Flip-Flop, a data input from said core logic and Shift data and having an output connected to an input to the other of said multiplexers.

39. In an integrated circuit as defined in claim 31, further including a clock source for the clock signal required by said clock domains, further including means responsive to a Test Mode signal and associated with each said clock signal for selecting said associated clock signal during normal operation of said circuit and for selecting test clock signal during testing of said circuit.

40. In an integrated circuit as defined in claim 31, further including means for analyzing said data captured by said scannable memory elements concurrently with shifting data out of said scannable elements.

41. In an integrated circuit as defined in claim 31, further including means for generating said test clock.

42. In an integrated circuit as defined in claim 34, further including means for generating a Test Mode signal for placing said circuit in a self-test mode and applying said Test clock to said core logic and said control elements.

43. In an integrated circuit having core logic with two or more clock domains and at least one signal path originating in one of said clock domains and terminating in an other of said clock domains, the improvement comprising:

means for generating a test clock signal;

means for generating a Test Mode signal for placing said circuit in a self-test mode and applying said Test clock to said core logic and said control elements;

a source control element and an associated destination control element associated with each signal path for exchanging data between said one and said other of said clock domains, said source control element being located in said one clock domain and said associated destination element being located in said other domain, said control elements being arranged in groups in which each group contains at least one of said control elements and any other element which does not interact with the clock domain of an other element in the group and which is not in a member of another of said groups, each member in each group receiving the same Scan Enable and Capture Disable signals;

each said control element being a scannable memory element having an input and an output and being configurable a SHIFT mode for shifting data from its input to its output and a CAPTURE mode for capturing data applied its input, each said source control element being further configurable in a HOLD mode for holding its output constant;

said control elements being configurable in said modes in response to predetermined combinations of a Scan Enable signal for enabling or disabling shifting of data therethrough and a Capture Disable signal having a one value to cause a recipient control element to enable said CAPTURE mode and another value to cause a recipient control element to enable said HOLD mode;

a controller for generating said Capture Disable signal for each said group and for each cycle of a test clock signal;

Logic Circuit means associated with each said group and responsive to said Scan Enable signal and said Capture Disable signal for generating control element configuring signals for configuring each said control element in said group in one of said modes and including means for applying said control element configuring signals to all control elements which are to be concurrently configured in the same manner;

each said control elements including a Flip-Flop having an input, an output and a clock input, and means responsive to said Scan Enable and Capture Enable signal for configuring said Flip-Flop in a SHIFT mode for shifting data through said Flip-Flop, a CAPTURE mode for capturing data at said Flip-Flop output or a HOLD mode;

said means responsive being first and second multiplexers each having a control input, a pair of inputs and an output, one of said multiplexers receiving one of said Scan Enable and Capture Disable signals at its control input and the output of the other of said multiplexers and one of the output of said Flip-Flop, a data input from said core logic and Shift data, and an output connected to said Flip-Flop input, the other of said multiplexers receiving the other of said Scan Enable and said Capture Disable signals at its control input and the other two of the output of said Flip-Flop, a data input from said core logic and Shift data and having an output connected to an input to the other of said multiplexers; and a clock source for the clock signal required by said clock domains, further including means responsive to a Test Mode signal and associated with each said clock signal for selecting said associated clock signal during normal operation of said circuit and for selecting test clock signal during testing of said circuit.

* * * * *